(12) United States Patent
Komiyama (10) Patent No.: US 6,424,050 B1
(45) Date of Patent: Jul. 23, 2002

(54) SEMICONDUCTOR DEVICE

(75) Inventor: Tadashi Komiyama, Kofu (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/668,241

(22) Filed: Sep. 20, 2000

(30) Foreign Application Priority Data

Sep. 22, 1999 (JP) .......................................... 11-269388

(51) Int. Cl.[7] .......................... H01L 28/48; H01L 23/52; H01L 29/40
(52) U.S. Cl. ........................................ 257/777; 257/778
(58) Field of Search .............................. 257/778, 777, 257/783, 786, 686, 723, 724

(56) References Cited

U.S. PATENT DOCUMENTS

| | | | | |
|---|---|---|---|---|
| 5,327,325 A | * | 7/1994 | Nicewarner, Jr. | |
| 5,777,391 A | * | 7/1998 | Nakamura et al. | |
| 6,177,721 B1 | * | 1/2001 | Suh et al. | |
| 6,184,463 B1 | * | 2/2001 | Panchou et al. | |
| 6,201,302 B1 | * | 3/2001 | Tzu | |
| 6,208,521 B1 | * | 3/2001 | Nakatsuka et al. | |
| 6,225,688 B1 | * | 5/2001 | Kim et al. | |

* cited by examiner

*Primary Examiner*—Sheila V. Clark
(74) *Attorney, Agent, or Firm*—Hogan & Hartson, L.L.P.

(57) ABSTRACT

An IC chip 1 is a flip chip type, which defines a main surface as a mounting surface that is externally exposed and is provided with external terminals 15 on pads 14. An IC chip 2 within a sealant member 6 is stacked on a rear surface of the IC chip 1 through an insulation adhesive member 3. A wiring substrate 4 for the IC chip 2 is provided around the IC chip 1. The wiring substrate 4 includes a base substrate 41 and an insulation film 43 having a conductive pattern 42 provided thereon. Specified portions of the conductive pattern 42 are connected respectively to pads 21 on the IC chip 2 by, for example, bonding wires 5. External terminals 45 for the IC chip 2 connect to a plurality of vias 44 in the wiring substrate 4. The above structure provides a semiconductor device that can achieve a thinner package while maintaining the reliability of each of the stacked IC chips at a high level.

26 Claims, 7 Drawing Sheets

SEMICONDUCTOR DEVICE

TECHNICAL FILED

The present invention relates to a semiconductor device having a stacked type IC that requires a thinner package, and more particularly relates to a stacked type CSP (Chip Size Package).

BACKGROUND TECHNOLOGY

In pursuit of a semiconductor integrated circuit of a more compact size with a higher integration, a semiconductor package also requires to be reduced in size. A CSP (Chip Size Package) provides a useful structure that requires a small mounting area and therefore satisfies the requirements described above.

A stacked type CSP is attracting attention as one of the packages applicable to a highly integrated IC.

Figure 7:
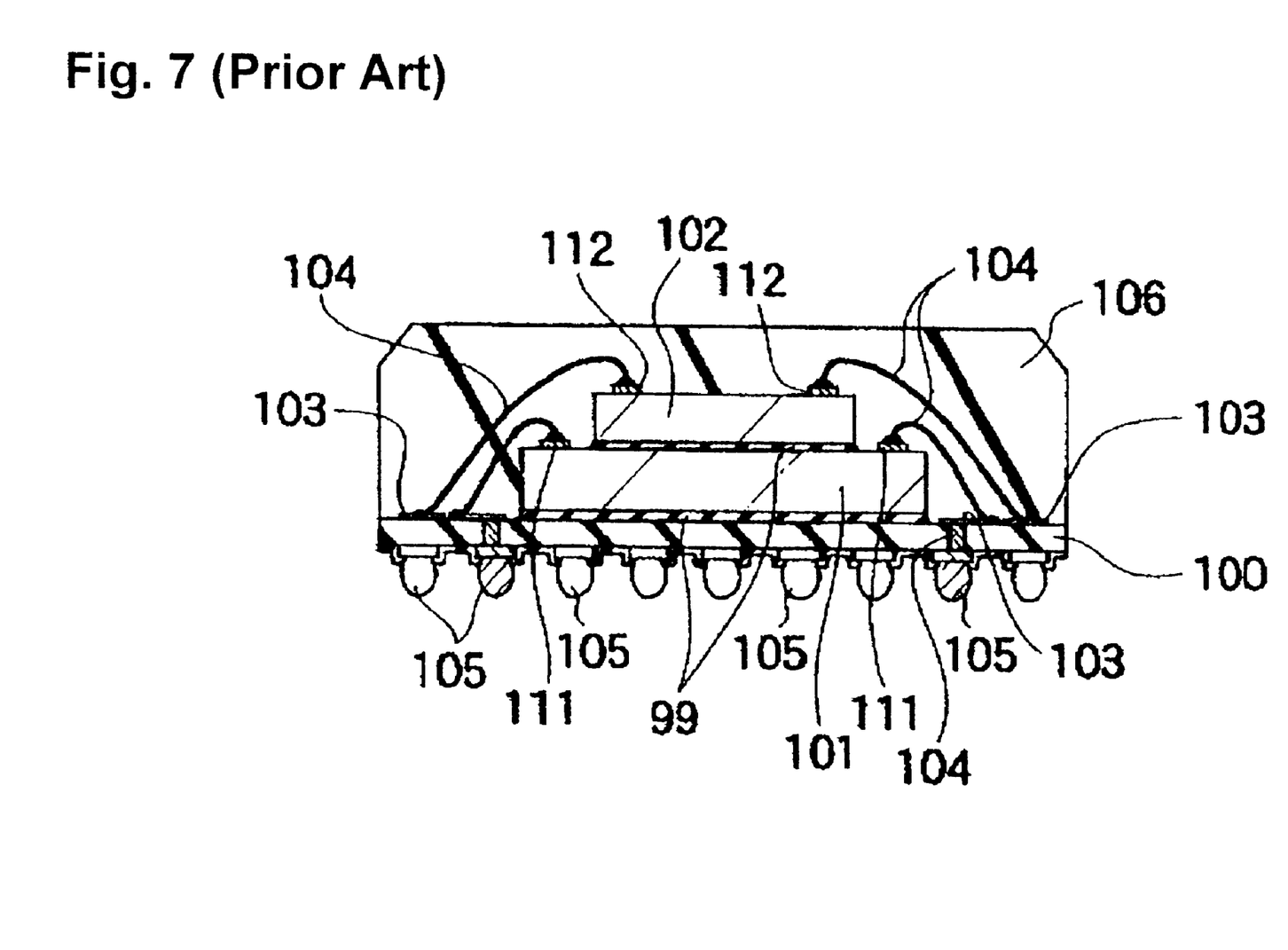
FIG. 7 is a cross-sectional view of a structure of a conventional stacked type CSP.

FIG. 7 shows a cross section of a structure of a conventional stacked type CSP. A base substrate 100 has a size that is about the size of a chip. Two IC chips 101 and 102 that are stacked one on top of the other are mounted on a main surface of the base substrate 100 through insulation adhesive members 99. A plurality of conductive patterns 103 and a plurality of vias 104 are provided on the main surface of the base substrate 100. External terminals 105 such as solder balls to be connected to the respective vias 104 are provided on a rear surface of the base substrate 100.

On the side of the main surface of the base substrate 100, electrode pads 111 and 112 of the stacked IC chips 101 and 102 are electrically connected in a specified manner to the base substrate 100 through bonding wires (gold wires) 104. It is noted that the IC chip 102 has a size that does not overlap the electrode pads 111 that are provided around the IC chip 101, and is fixedly adhered to the first IC chip by the adhesive member 99. The stacked IC chips 101 and 102 and the electrical connection structure are sealed by a sealant resin 106 to thereby form a package.

As described above, the conventional stacked type CSP has a stacked structure in which the base substrate 100 that forms a mounting surface, the first IC chip 101, the second IC chip 102 and the adhesive members 99 for fixedly adhering them together are stacked one on top of the other. The thickness of the semiconductor package is determined by the stacked structure.

It is noted that the thickness of the semiconductor package is considered to be an important factor when it is mounted on a hand-carry type device, and therefore a further reduction in size and thickness of a semiconductor package is sought. As some of the measures to make an entire package thinner, the base substrate 100 is reduced in size and thickness, and each of the IC chips 101 and 102 is cut down in thickness within a range that does not affect their reliability.

However, a high level of technique is required to reduce the size and thickness of the base substrate 100 due to the complexity of the conductive patterns provided for the IC chips 101 and 102. Also, the IC chips would likely break because the IC chips are made thinner by cutting the IC chips. As a result, the manufacturing process before the packaging process becomes difficult to handle, and the manufacturing facility requires modifications.

However, the measures described above would present their limitations before they can effectively work in reducing the package in thickness. In other words, a stacked type CSP cannot be sufficiently reduced in size and thickness, while there are greater risks such as a lowered reliability in the manufacturing process, a higher cost, and the like.

The present invention has been made in view of the situations described above. It is an object of the present invention to provide a semiconductor device that can reduce its package in size and thickness by modifications of the configuration of the package while maintaining the high reliability of each of the stacked IC chips.

DESCRIPTION OF THE INVENTION

A semiconductor device in accordance with the present invention comprises a first IC chip having a main surface as a mounting surface on which electrode pads are provided, the main surface being externally exposed and provided with external terminals, a second IC chip that is stacked through an insulation member on a rear surface opposite to the main surface of the first IC chip, a wiring substrate for the second IC chip provided around the first IC chip, external terminals for the second IC chip provided on a mounting surface of the wiring substrate, and a sealant member that seals the second IC chip and electrical connection components therefor with the wiring substrate.

In accordance with the present invention, the first IC chip is not sealed, and only the second IC chip is sealed. Only wirings for the second IC chip may be considered for the wiring substrate. As a result, the sealant member becomes thin, but the wiring substrate has the same thickness as that of the first IC chip and therefore does not present any problem in its structural strength. Also, a protection member covers at least the electrical connection components for the second IC chip. This provides a structure in which the entire second IC chip may not necessarily be sealed.

PREFERRED EMBODIMENTS OF THE INVENTION

Embodiments of the present invention are described below with reference to the accompanying drawings.

Figure 1:
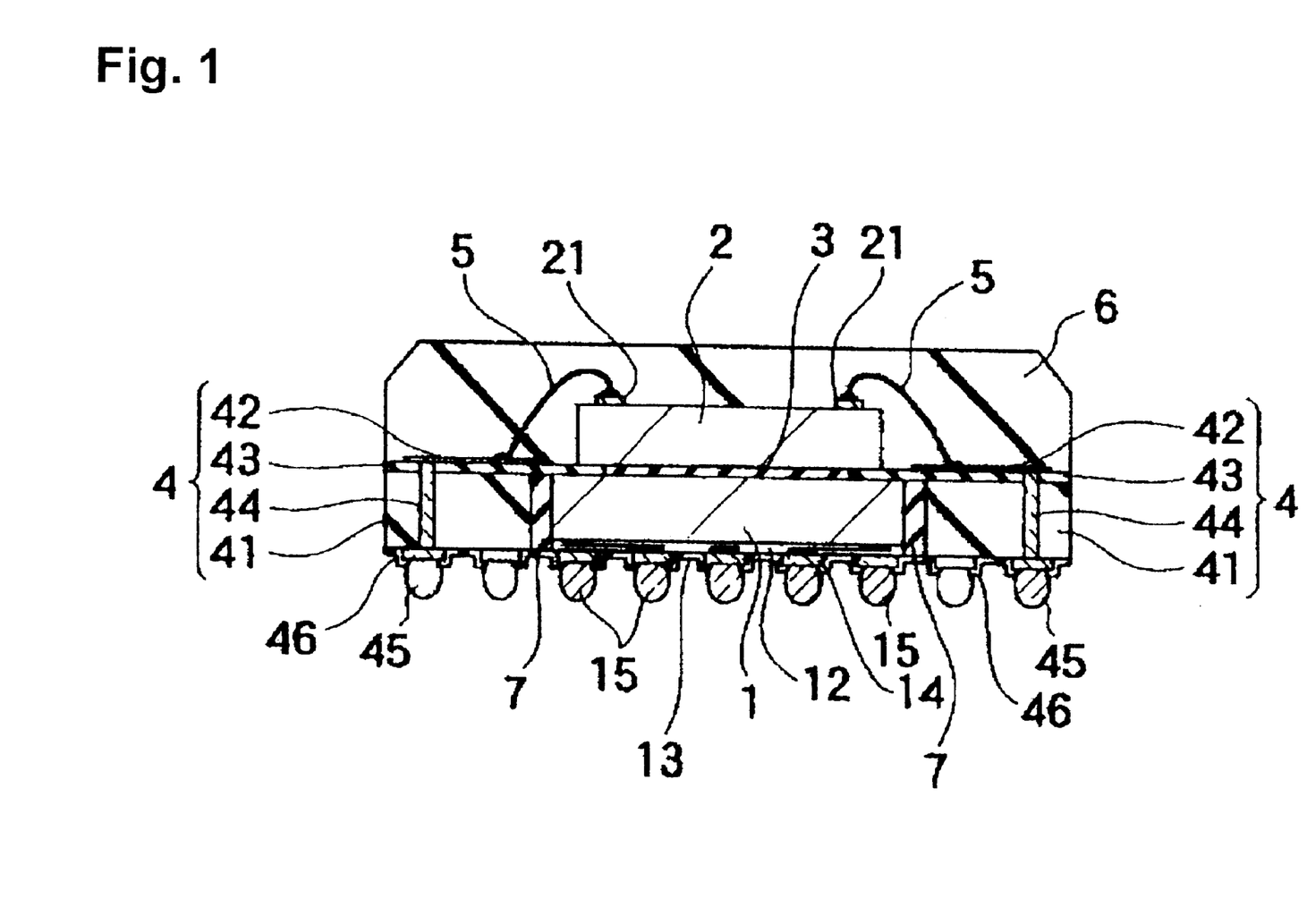
FIG. 1 is a cross-sectional view of a stacked type CSP in accordance with a first embodiment of the present invention.

FIG. 1 is a cross-sectional view of a stacked type CSP in accordance with a first embodiment of the present invention. An IC chip 1 is mounted in a flip Chip configuration (a face dawn configuration). The IC chip 1 has a main surface as a mounting surface that is provided with electrode pads and is externally exposed. In other words, pads 14 are provided over a wiring region 12 above an insulation film (solder resist) 13. An IC chip 2 is stacked on a rear surface of the IC chip 1 through an insulation adhesive member 3.

A wiring substrate 4 for the IC chip 2 is provided around the IC chip 1. The wiring substrate 4 includes a base substrate 41 and an insulation film 43 on which a conductive pattern 42 is formed. More specifically, the insulation film 43 extends at least in a peripheral region around the rear surface of the IC chip 1 and fixedly adhered to the base substrate 41. Specified portions of the conductive pattern 42 are connected to pads 21 on a main surface of the IC chip 2 by, for example, bonding wires 5.

Also, the wiring substrate 4 includes a plurality of vias 44. External terminals 45 for the IC chip 2 are provided on a mounting surface of the wiring substrate 4. It is noted that the conductive pattern 42 of the wiring substrate 4 is connected to the external terminals 45 through the vias 44. Areas other than the pads to be connected to the external terminals 45 are covered by an insulation film (solder resist) 46.

The sealant member 6 airtightly seals electrical connection components between the IC chip 2 and the wiring substrate 4 including the IC chip 2 and the bonding wires 5. Also, a gap between the IC chip 1 and the wiring substrate 4 is filled with an insulation member 7.

By the structure descried above, the IC chip 1 among the stacked IC chips is provided below a central area of the sealant member 6 without being sealed. As a result, the sealant member 6 is substantially thinner than the equivalent member of the conventional structure and provides a highly reliable airtight sealing. Also, the above structure reduces the material required for the sealant member, and therefore is more economical.

Moreover, the thickness of the wiring substrate 4 depends on the thickness of the IC chip 1, and has a sufficient structural strength. The thickness of the wiring substrate 4 does not affect the overall thickness of the apparatus. Also, only wirings for the IC chip 2 may be considered for the wiring substrate 4. Accordingly, the degree of freedom in wiring in the wiring substrate 4 is increased and the electrical characteristics are improved. Also, the bonding wires 5 can be made shorter and provided lower compared to a conventional stacked IC. This results in a greater reliability and an improved electric characteristic.

In the embodiment shown in FIG. 1, the gap between the IC chip 1 and the wiring substrate 4 is filled with the insulation member 7. However, the IC chip 1 and the wiring substrate 4 may be formed without a gap, and the insulation member 7 may not be present in the gap. Alternatively, the insulation member 7 may be provided as a very thin adhesive material layer. Also, the IC chip 2 may not necessarily be smaller than the IC chip 1, as required in the conventional structure. This is because the pads for the IC chip 1 are provided on the mounting surface of the IC chip 1.

Furthermore, the insulation film 43 extends only in the peripheral region around the rear surface of the IC chip 1, and only the insulation adhesive member is adhered to a central area in the rear surface of the IC chip 1. However, the present invention is not limited to this structure. The insulation film 43 can be extended to the central area of the rear surface of the IC chip 1.

Figure 2A:
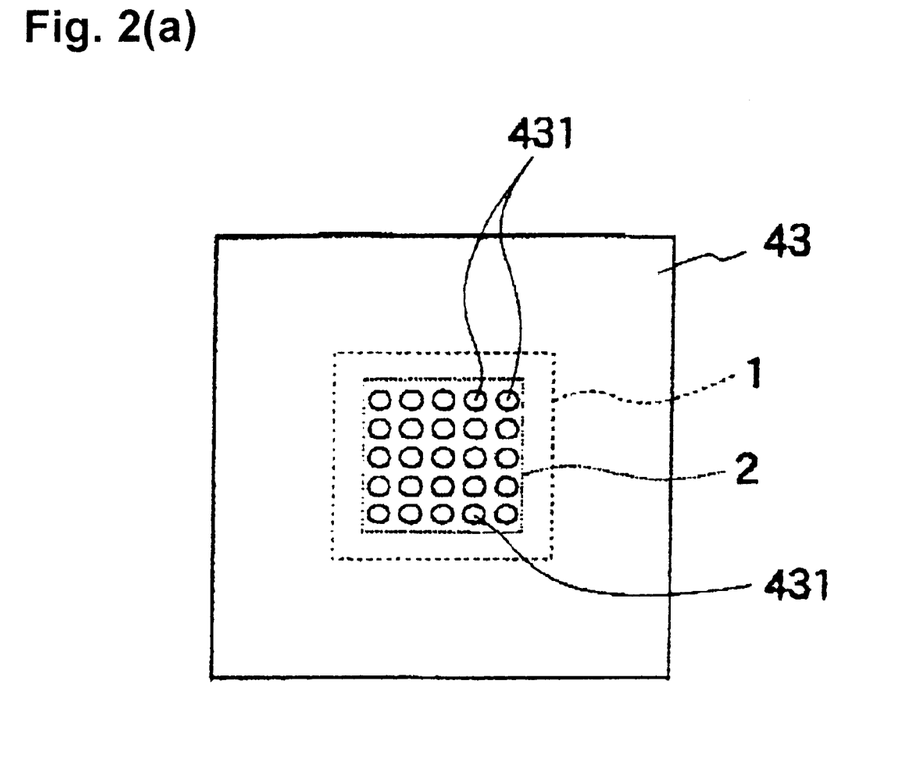
FIG. 2 is a plan view of a main structure of an example in which a part of the first embodiment is modified.
Figure 2B:
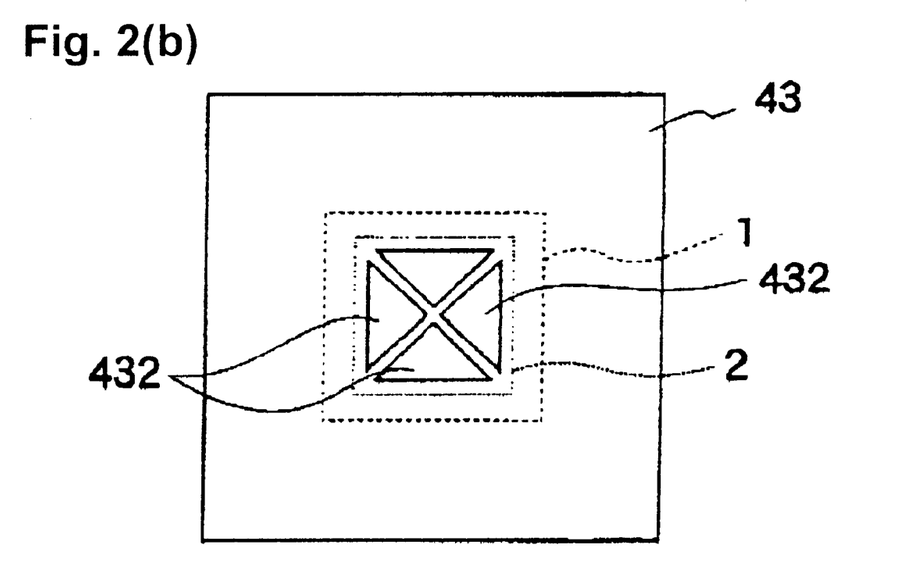

For example, insulation films 43 shown in FIGS. 2(a) and 2(b) can be formed. Broken lines indicate the IC chips 1 and 2, respectively. More particularly, the insulation film 43 may be provided with an opening section 431 (shown in FIG. 2(a)) or an opening section 432 (shown in FIG. 2(b)) in a region where the IC chip 2 is fixedly adhered. As a result, the adhesive member 3 shown in FIG. 1 adheres the IC chip 1 to the IC chip 2 through the opening section 431 or the opening section 432. As a result, the IC chips 1 and 2 and the insulation film 43 achieve a strongly bonded structure.

Figure 3:
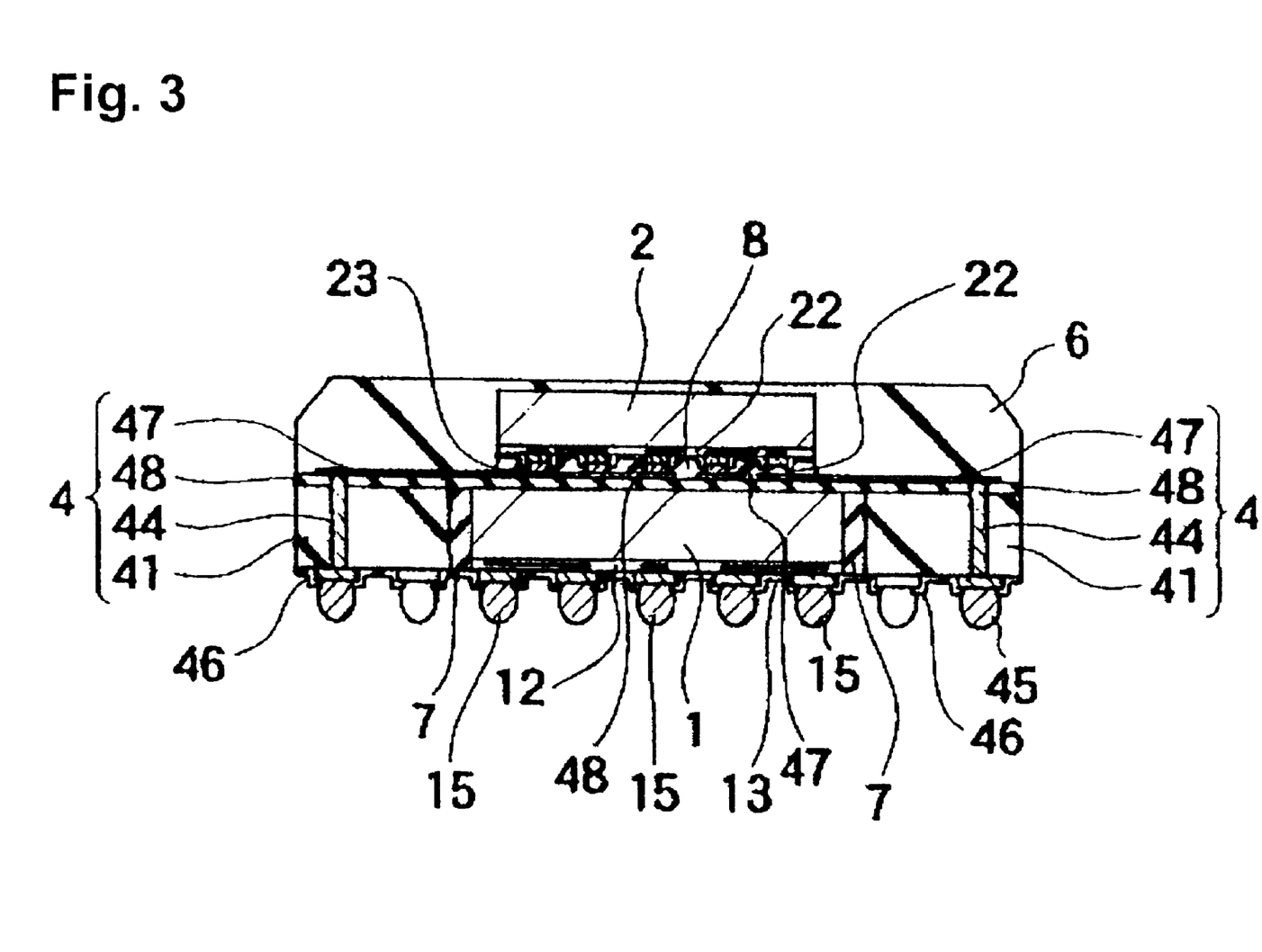
FIG. 3 is a cross-sectional view of a stacked type CSP in accordance with a second embodiment of the present invention.

FIG. 3 is a cross-sectional view of a stacked type CSP in accordance with a second embodiment of the present invention. The same reference numbers are used for elements similar to those of the first embodiment. The second embodiment is different from the first embodiment in that an IC chip 2 is also mounted in a flip chip configuration (a face down configuration).

An insulation film 48 is formed on a rear surface of the IC chip 1 that is provided in a flip chip configuration through an adhesive member (not shown). The insulation film 48 has a conductive pattern 47 relating to a wiring substrate 4. Specified portions of the conductive pattern 47 are connected to protruded electrodes 23 that are provided over a main surface of the IC chip 2 through a wiring region 22. An insulation protective member 8 is provided in a region between the IC chip 2 and the insulation film 48.

Also, the wiring substrate 4 has a plurality of vias 44 in a similar manner as the first embodiment. External terminals 45 for the IC chip 2 are provided on a mounting surface of the wiring substrate 4. It is noted that the conductive pattern 47 is connected to the external terminals 45 through the vias 44. Areas in the mounting surface other than pads to be connected to the external terminals 45 are covered by an insulation film (solder resist) 46.

A sealant member 6 airtightly seals an electrical connection side between the IC chip 2 and the wiring substrate 4 in a similar manner as the first embodiment. Also, a gap between the IC chip 1 and the wiring substrate 4 is filled with an insulation member 7. However, for example, although not shown, almost no gap may be provided between the IC chip 1 and the wiring substrate 4, and the insulation member 7 may be provided as a very thin adhesive layer.

By the structure descried above, the IC chip 1 among the stacked IC chips is provided below a central area of the sealant member 6 without being sealed, in a similar manner as the first embodiment. The thickness of the wiring substrate 4 depends on the thickness of the IC chip 1, has a sufficient structural strength, and does not affect the overall thickness of the device. Also, only wirings for the IC chip 2 may be considered when designing the wiring substrate 4. Accordingly, the degree of freedom in wiring is increased and electrical characteristics of the device are improved.

Also, the IC chip 2 may not necessarily be smaller than the IC chip 1 as required in the conventional structure. Also, the IC chip 2 that is sealed; by a resin is mounted in a face down configuration, and can be sealed without giving a space to accommodate the height of loops of the bonding wires 5, which is required in the first embodiment. As a result, the sealant member 6 can be made much thinner compared to the first embodiment.

Moreover, since the IC chip 2 is mounted in a face down configuration, the sealant member 6 may be changed to an airtight sealing structure that is provided by a dripping method, for example. Also, only a protection film may be used to cover the top surface of the wiring substrate 4. This contributes to a reduction of the overall weight.

Figure 4:
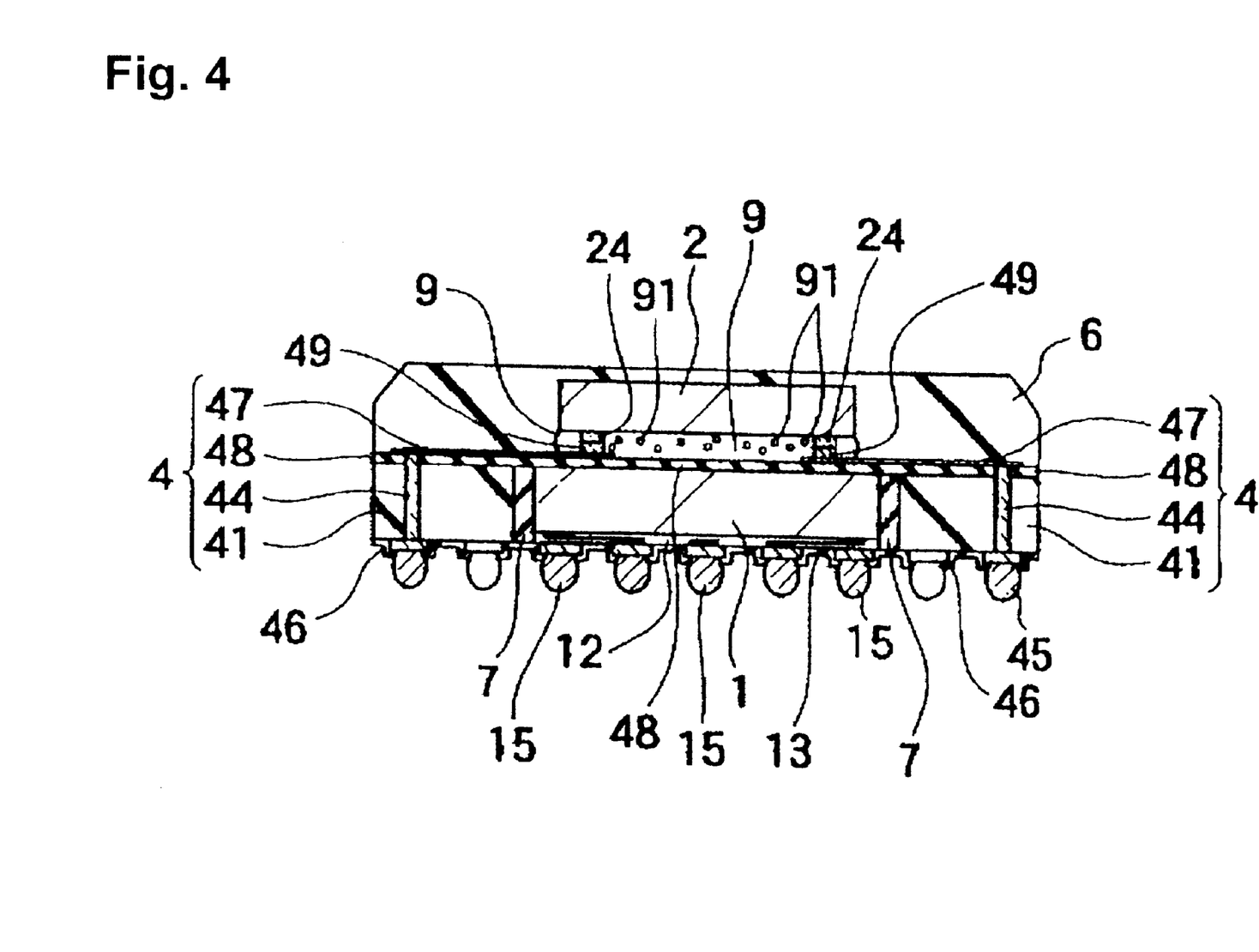
FIG. 4 is a cross-sectional view of a stacked type CSP in accordance with a third embodiment of the present invention.

FIG. 4 is a cross-sectional view of a stacked type CSP in accordance with a third embodiment of the present invention. The same reference numbers are used for elements similar to those of the second embodiment. The third embodiment is different from the second embodiment in that an IC chip 2 mounted in a flip-chip configuration (a face down configuration) is connected to a conductive pattern 47 by an anisotropic conductive film (ACF) 9.

An insulation film 48 is formed on a rear surface of the IC chip 1 that is mounted in a flip chip configuration through an adhesive member (not shown). The insulation film 48 has the conductive pattern 47 for a wiring substrate 4. Protruded electrodes 49 are provided at specified portions of the conductive pattern 47, and are respectively connected to protruded electrodes 24 formed on a main surface of the IC chip 2 by the ACF 9.

The ACF 9 contains conductive particles 91 dispersed in epoxy resin in a film shape. A conductive state is obtained at a specified conduction portion that interposes the conductive particles 91 when the gap of the conduction portion becomes smaller than the particle diameter of the conductive particles 91, and the other portions are in an insulating state. The ACF 9 is provided in a gap between the IC chip 2 and the insulation film 48.

The protruded electrodes 49 formed on the conductive pattern 47 on the insulation film 48 are positioned at the protruded electrodes 24 of the IC chip 2, and a pressure/heating process by a pressure connection tool (not shown) is conducted. Connected portions between the conductive electrodes (24 and 49) of the IC chip 2 and the conductive pattern 47 achieve a good conductivity due to the conductive particles 91 in the ACF 9.

Also, the wiring substrate 4 includes a plurality of vias 44 in a similar manner as the first and second embodiment IC chip 2 are provided on a mounting surface of the wiring substrate 4. It is noted that the conductive pattern 47 is connected to the external terminals 45 through the vias 44. Areas in the mounting surface other than pads to be connected to the external terminals 45 are covered by an insulation film (solder resist) 46.

A sealant member 6 airtightly seals an electrical connection side between the IC chip 2 and the wiring substrate 4 in a similar manner as the first and second embodiments. Also, a gap between the IC chip 1 and the wiring substrate 4 is filled with an insulation member 7. However, for example, almost no gap may be provided between the IC chip 1 and the wiring substrate 4 (not shown); and the insulation member 7 may be provided as a very thin adhesive layer.

By the structure descried above, the IC chip 1 among the stacked IC chips is provided below a central area of the sealant member 6 without being sealed, in a similar manner as the first and second embodiments. The thickness of the wiring substrate 4 depends on the thickness of the IC chip 1, has a sufficient structural strength, and does not affect the overall thickness of the device. Also, only wirings for the IC chip 2 may be considered when designing the wiring substrate 4. Accordingly, the degree of freedom in wiring is increased and electrical characteristics of the device are improved.

Also, the IC chip 2 may not necessarily be smaller than the IC chip 1 as required in the conventional structure. Also, the IC chip 2 that is sealed by a resin is mounted in a face down configuration. As a result, a much thinner configuration can be obtained compared to the first embodiment, in a similar manner as the second embodiment.

Moreover, since the IC chip 2 is mounted in a face down configuration and connected by the ACF, the sealant member 6 may be changed to an airtight sealing structure that is provided by a dripping method, for example. Also, a protection film may be used to cover only the top surface of the wiring substrate 4.

Figure 5:
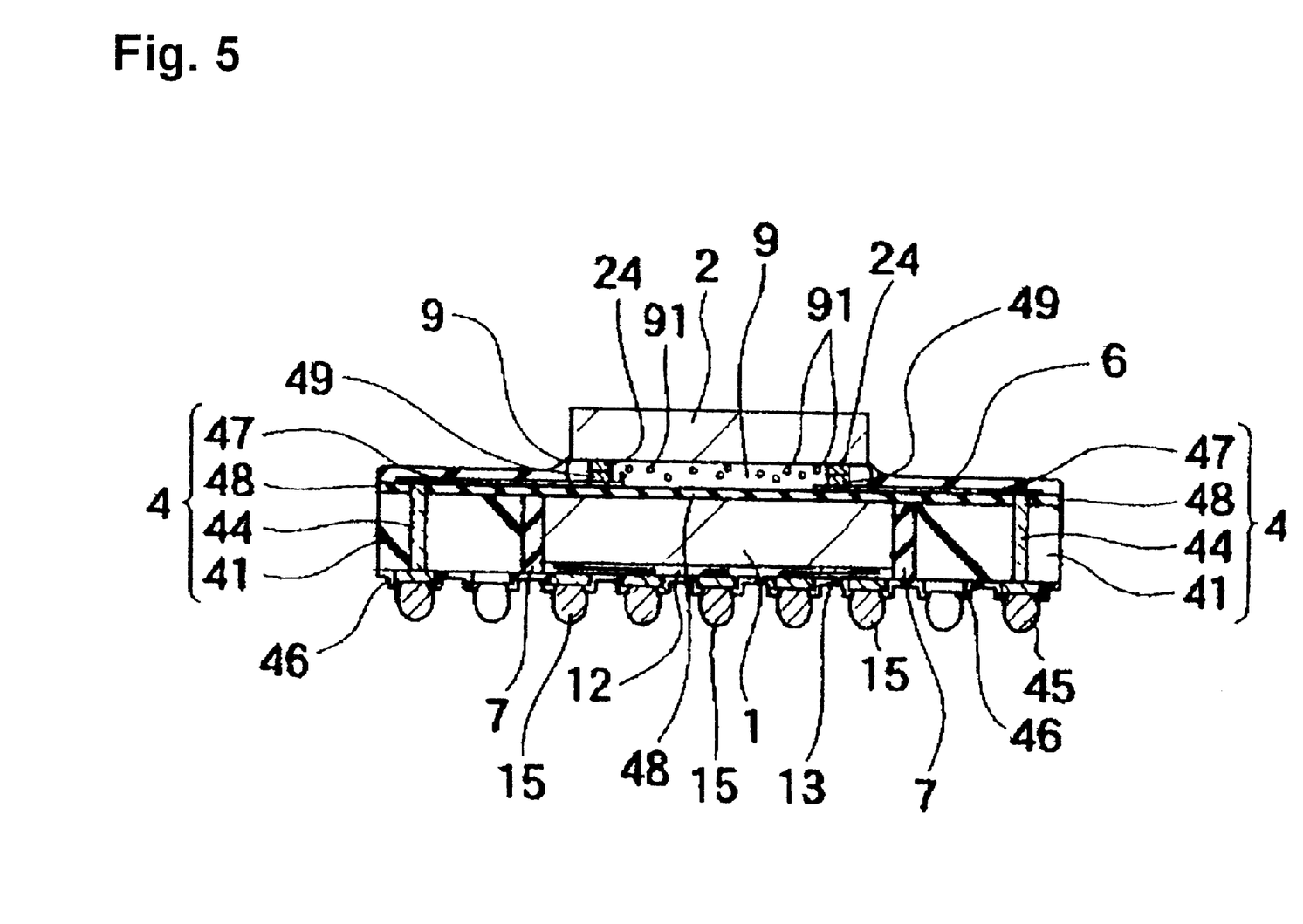
FIG. 5 is a cross-sectional view of a stacked type SCP that is a modified example of the third embodiment of the present invention.

FIG. 5 is a cross-sectional view of a stacked type CSP in accordance with a modification example of the third embodiment of the present invention. The same reference numbers are used for elements similar to those in the third embodiment. An IC chip 2 is connected to a conductive pattern 47 by an anisotropic conductive film (ACF) in a similar manner as the third embodiment. An insulation protection member 61 covers the wiring substrate 4 and electrical connection components to be connected to the IC chip 2. As a result, the sealant member 6 shown in FIG. 3 is not required. This structure is applicable to the embodiment shown in FIG. 2; as described above in connection with the second embodiment. As a result, the entire IC chip 2 may not necessarily be sealed, and a structure that results in a lighter weight can be realized.

Figure 6:
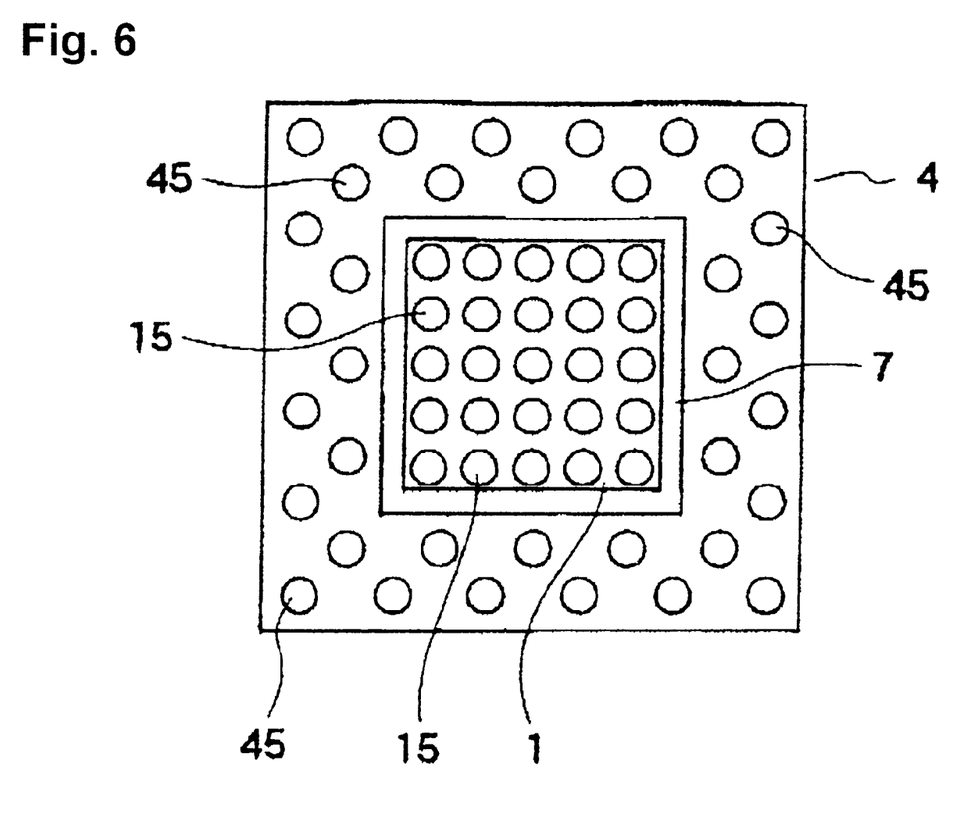
FIG. 6 is a plan view of a main part on the side of a mounting surface of a semiconductor package in the first embodiment or the third embodiment (including its modification examples).

FIG. 6 is a plan view of a major portion of a mounting surface of a semiconductor package relating to the first through third embodiments (including modified examples). In accordance with the respective embodiments, the IC chip 1 that is located at a lower layer of the stacked IC chips is not sealed, provided in a central area below the sealant member 6, and has the external terminals 15 provided thereon. The external terminals 45 for the IC chip 2 are arranged on the wiring substrate 4 about the IC chip 1.

By the structure described above, the risks that may derive from making the base substrate thinner or cutting the IC chips in the conventional technique can be substantially reduced, while the semiconductor package can be made thinner. In addition, internal routing of wires and leading the wires to external terminals are simplified. Even if pads of stacked IC chips need to be connected to each other, they can be connected on a mounting substrate. As a result, a thinner and more compact semiconductor package can be realized while maintaining its reliability at a high level.

INDUSTRIAL USABILITY

In accordance with the present invention described above, among stacked IC chips in a stacked type CSP, a lower IC chip is not sealed, and only an upper IC chip is sealed. Also, at least electric connection components between the upper IC chip and a wiring substrate are covered by a protection member, such that the entire upper IC chip may not necessarily be sealed. This contributes to a reduction of the weight.

Only wirings for the upper IC chip may be considered for the wiring substrate that is disposed around the lower IC chip, the sealant member can be formed thinner, and the wiring substrate can have the same thickness as that of the lower IC chip and therefore does not have problems in its structural strength. As a result, a semiconductor device that can achieve a smaller and thinner package is provided, while maintaining the reliability of each of the stacked IC chips at a high level.

What is claimed is:

1. A semiconductor device comprising:
  a first IC chip having a main surface as a mounting surface on which electrode pads are provided, the main surface being externally exposed and provided with external terminals connected electrically to the electrode pads;
  a second IC chip that is stacked through an insulation member on a rear surface of the first IC chip opposite to the main surface thereof;
  a wiring substrate for the second IC chip provided around the first IC chip;
  external terminals for the second IC chip provided at least on a mounting surface of the wiring substrate; and a sealant member that seals electrical connection components between the second IC chip; and the wiring substrate.

2. A semiconductor device according to claim 1, wherein the insulation member includes an adhesive.

3. A semiconductor device, comprising:
a first IC chip having a main surface as a mounting surface on which electrode pads are provided, the main surface being externally exposed and provided with external terminals;
a second IC chip that is stacked through an insulation member on a rear surface of the first IC chip opposite to the main surface thereof;
a wiring substrate for the second IC chip provided around the first IC chip, wherein the insulation member includes a conductive film-like pattern at a specified region of the wiring substrate that serves as an electrical connection between the second IC chip and the wiring substrate;
external terminals for the second IC chip provided on a mounting surface of the wiring substrate; and
a sealant member that seals electrical connection components between the second IC chip and the wiring substrate.

4. A semiconductor device, comprising:
a first IC chip having a main surface as a mounting surface on which electrode pads are provided, the main surface being externally exposed and provided with external terminals;
a second IC chip that is stacked through an insulation member on a rear surface of the first IC chip opposite to the main surface thereof;
a wiring substrate for the second IC chip provided around the first IC chip, wherein the insulation member includes a conductive film-like pattern at a specified region of the wiring substrate that serves as an electrical connection between the second IC chip and the wiring substrate, and extends at least in a peripheral region about a rear surface of the first IC chip;
external terminals for the second IC chip provided on a mounting surface of the wiring substrate; and
a sealant member that seals electrical connection components between the second IC chip and the wiring substrate.

5. A semiconductor device comprising:
a first IC chip having a main surface as a mounting surface on which electrode pads are provided, the main surface being externally exposed and provided with external terminals connected electrically to the electrode pads;
a second IC chip that is stacked through an insulation member on a rear surface of the first IC chip opposite to the main surface thereof;
a wiring substrate provided around the first IC chip and having an electrical connection component to be connected to the second IC chip; and
external terminals for the second IC chip provided at least on a mounting surface of the wiring substrate.

6. A semiconductor device according to claim 5, wherein at least the electrical connection component to be connected to the second IC chip is covered by a protective member.

7. A semiconductor device according to claim 1, wherein the insulation member includes a conductive film-like pattern at a specified region of the wiring substrate that serves as an electrical connection between the second IC chip and the wiring substrate.

8. A semiconductor device according to claim 4, wherein the insulation member includes a conductive film-like pattern at a specified region of the wiring substrate that serves as an electrical connection between the second IC chip and the wiring substrate.

9. A semiconductor device according to claim 5, wherein the insulation member includes a conductive film-like pattern at a specified region of the wiring substrate that serves as an electrical connection between the second IC chip and the wiring substrate.

10. A semiconductor device according to claim 1, wherein the insulation member includes a conductive film-like pattern at a specified region of the wiring substrate that serves as an electrical connection between the second IC chip and the wiring substrate, and extends at least in a peripheral region about a rear surface of the first IC chip.

11. A semiconductor device according to claim 3, wherein the insulation member includes a conductive film-like pattern at a specified region of the wiring substrate that serves as an electrical connection between the second IC chip and the wiring substrate, and extends at least in a peripheral region about a rear surface of the first IC chip.

12. A semiconductor device according to claim 5, wherein the insulation member includes a conductive film-like pattern at a specified region of the wiring substrate that serves as an electrical connection between the second IC chip and the wiring substrate, and extends at least in a peripheral region about a rear surface of the first IC chip.

13. A semiconductor device according to claim 3, wherein the insulation member includes an adhesive.

14. A semiconductor device according to claim 4, wherein the insulation member includes an adhesive.

15. A semiconductor device according to claim 3, wherein the conductive film-like pattern contains conductive particles dispersed in epoxy resin.

16. A semiconductor device according to claim 4, wherein the conductive film-like pattern contains conductive e particles dispersed in epoxy resin.

17. A semiconductor device according to claim 1, wherein the wiring substrate includes aplurality of vias.

18. A semiconductor device according to claim 3, wherein the wiring substrate includes a plurality of vias.

19. A semiconductor device according to claim 4, wherein the wiring substrate includes aplurality of vias.

20. A semiconductor device according to claim 5, wherein the wiring substrate includes a plurality of vias.

21. A semiconductor device according to claim 7, wherein the conductive film-like pattern contains conductive particles dispersed in epoxy resin.

22. A semiconductor device according to claim 8, wherein the conductive film-like pattern contains conductive particles dispersed in epoxy resin.

23. A semiconductor device according to claim 9, wherein the conductive film-like pattern contains conductive particles dispersed in epoxy resin.

24. A semiconductor device according to claim 10, wherein the conductive film-like pattern contains conductive particles dispersed in epoxy resin.

25. A semiconductor device according to claim 11, wherein the conductive film-like pattern contains conductive particles dispersed in epoxy resin.

26. A semiconductor device according to claim 12, wherein the conductive film-like pattern contains conductive particles dispersed in epoxy resin.

* * * * *